(12) United States Patent  (10) Patent No.: US 7,922,821 B2
Soininen  (45) Date of Patent: Apr. 12, 2011

(54) SOURCE, AN ARRANGEMENT FOR INSTALLING A SOURCE, AND A METHOD FOR INSTALLING AND REMOVING A SOURCE

(75) Inventor: Pekka Soininen, Helsinki (FI)

(73) Assignee: Beneq Oy, Vantaa (FI)

( * ) Notice: Subject to any disclaimer, the term of this patent is extended or adjusted under 35 U.S.C. 154(b) by 331 days.

(21) Appl. No.: 11/918,125

(22) PCT Filed: Apr. 21, 2006

(86) PCT No.: PCT/FI2006/050159
§ 371 (c)(1),
(2), (4) Date: Oct. 10, 2007

(87) PCT Pub. No.: WO2006/111618
PCT Pub. Date: Oct. 26, 2006

(65) Prior Publication Data
US 2009/0277390 A1   Nov. 12, 2009

(30) Foreign Application Priority Data
Apr. 22, 2005  (FI) ...................................... 20055189

(51) Int. Cl.
*C23C 16/00* (2006.01)
(52) U.S. Cl. ....................................................... 118/726
(58) Field of Classification Search .................... 118/726
See application file for complete search history.

(56) References Cited

U.S. PATENT DOCUMENTS

| 4,160,692 | A | * | 7/1979 | Mitchell et al. ................. 159/6.2 |
| 4,543,467 | A |   | 9/1985 | Eisele et al. |
| 4,607,152 | A |   | 8/1986 | Allovon et al. |
| 5,482,892 | A |   | 1/1996 | Briones |
| 6,030,458 | A |   | 2/2000 | Colombo et al. |
| 6,162,300 | A |   | 12/2000 | Bichrt |
| 6,447,734 | B1 |   | 9/2002 | Hwu et al. |
| 6,743,473 | B1 | * | 6/2004 | Parkhe et al. .................. 427/252 |
| 2003/0037569 | A1 | * | 2/2003 | Arbab et al. ...................... 65/22 |
| 2004/0237892 | A1 | * | 12/2004 | Basceri et al. ................ 118/715 |

FOREIGN PATENT DOCUMENTS

| EP | 0 113 518 A2 | 7/1984 |
| GB | 2 361 051 A | 10/2001 |
| JP | A-2003-95787 | 4/2003 |

OTHER PUBLICATIONS

Serghini-Monim, S. et al., "New doser for chemical vapor deposition of low vapor-pressure solid precursors", *Rev. Sci, Instrum.*, vol. 56, No. 10, pp. 3672-3674, Oct. 1996.
Apr. 27, 2010 Supplemental European Search Report for European Patent Application No. 06725934.1.

* cited by examiner

*Primary Examiner* — Keath T Chen
(74) *Attorney, Agent, or Firm* — Oliff & Berridge, PLC

(57) ABSTRACT

The invention relates to an arrangement for installing a source into a gas deposition reactor. The arrangement comprises at least one source fitting for the source such that the source fitting is connected to a reaction space of the gas deposition reactor, and a source installable at least partly inside the source fitting or a source space connected to the source fitting. According to the invention, the arrangement further comprises reception means in the source fitting for receiving the source, and charging means for installing the source in place in the source fitting for use, and a chamber (1), provided in the source, for a solid or liquid source material (3), and isolating means (7, 19) for isolating the chamber (1) substantially from environment.

18 Claims, 1 Drawing Sheet

SOURCE, AN ARRANGEMENT FOR INSTALLING A SOURCE, AND A METHOD FOR INSTALLING AND REMOVING A SOURCE

BACKGROUND OF THE INVENTION

The invention relates to a source according to the preamble of claim 1 for installing a source into a gas deposition reactor. Particularly, the invention relates to a source for gas deposition methods, which source is insertable at least partly inside a source fitting provided in a gas deposition reactor or a source space connected to the source fitting, to an arrangement for installing a source into a gas deposition reactor, the arrangement comprising at least one source fitting for the source such that the source fitting is connected to a reaction space of the gas deposition reactor, and a source installable at least partly inside the source fitting or a source space connected to the source fitting, and to a method for installing a source into a gas deposition reactor and for removing the same therefrom.

When structures are manufactured by employing gas deposition methods, such as ALD (Atomic Layer Deposition) and other CVD (Chemical Vapor Deposition) methods, source materials are to be brought into a gaseous state prior to feeding them into a reactor space of a reactor. Many processes are provided with no suitable source materials in liquid or gaseous state, so such processes have to utilize solid materials. Since vapour pressures of solid materials are quite low (typically less than 1 mbar at room temperature), they have to be heated in order to achieve a sufficient vapour pressure. Solid sources have thus been developed.

In prior art, solid sources have been tubes that have been placed in an oven and provided with a source crucible therein. In such a solution, a source pipework of a reactor consists of a multi-branch, candelabrum-like pipework, which is preferably made of glass and in which different solid sources reside in different branches that can be heated independently, a reactor space of the reactor being provided at the foot of the candelabrum-like pipework. The process of charging the solid sources is carried out by inserting an open source crucible into a source tube by means of e.g. a thermo-element. In another embodiment, a source crucible was placed in a plastic bag while inserting it into a source tube so as to prevent the source material from becoming oxidized or from reacting with another substance present in room air or, in turn, from evaporating into room air.

A problem with the above-described arrangement is that installing a solid source material into a gas deposition reactor is not an inert procedure, but the arrangement is subject to contamination occurring in connection with installation and removal of the solid source, since the solid source materials used may be highly reactive and sensitive to oxygen and moisture, and they may emit detrimental compounds as vapour. In addition, this prior art solution for installing and removing a solid source is complex, unreliable and difficult to use.

Another prior art solution for installing a solid source into a gas deposition reactor is to utilize a metallic bottle equipped with valves such that a solid source is inserted in the metallic bottle, which, together with the valves, is placed in a vacuum or convection oven. This solution provides an inert method for installing a solid source, but the highest possible operating temperature, approximately 200 to 250° C., is determined by the valves, whose operating life becomes significantly shorter at high temperatures. If the valves are placed outside the oven, additional fittings have to be provided; furthermore, the structure develops heat bridges. In addition, the bottles and parts of the pipework are made of metal, which, due to possible chemical reactions, restricts possible solid source materials available. Furthermore, such bottles, being large and heavy, are difficult to install and detach, and such work also requires tools; in addition, the bottles are expensive. When being replaced, the pipeworks have to be flushed, which makes the solution even more complex.

BRIEF DESCRIPTION OF THE INVENTION

An object of the invention is thus to provide a source, an arrangement for installing a source, and a method for installing and removing a source so as to enable the above-mentioned problems to be solved. The object of the invention is achieved by a source according to the preamble of claim 1, which is characterized in that the source comprises a chamber for a solid or liquid source material, the chamber comprising at least one at least partly open wall, and cover-like isolating means arrangeable onto the wall of the chamber for isolating the chamber from environment, the cover-like isolating means and the chamber being arranged to be slid with respect to one another in order to open and/or close the chamber after the source is installed in the source fitting. The object of the invention is further achieved by an arrangement according to the preamble of claim 19, which is characterized in that the arrangement comprises reception means in the source fitting for receiving the source, and charging means for installing the source in place in the source fitting for use, and a chamber, provided in the source, for a solid or liquid source material, and cover-like isolating means for isolating the chamber substantially from environment. The object of the invention is further achieved by a method according to the preamble of claim 30, which is characterized by comprising the following steps:

a) inserting a source, which comprises a substantially from environment isolatably closable and openable chamber for a solid or liquid source material, at least partly inside a source fitting of a gas deposition reactor or a source space connected to the source fitting when the chamber is closed;

b) closing the source fitting when the source resides in place;

c) opening the chamber of the source for use of the source material by sliding the chamber and cover-like isolating means arranged onto an at least partly open wall of the chamber with respect to one another;

d) closing the chamber of the source after using the solid or liquid source material by sliding the chamber and the cover-like isolating means arranged onto the at least partly open wall of the chamber with respect to one another;

e) opening the source fitting in order to remove the source; and f) removing the source from the source fitting of the gas deposition reactor.

Preferred embodiments of the invention are disclosed in the dependent claims.

The invention is based on the idea of providing a source which is insertable at least partly, preferably completely, inside a source fitting provided in a gas deposition reactor, or a receptacle provided in the source fitting, or a connective recess, or a separate space connected to the source fitting and arranged to receive the source. The source comprises a chamber for a solid or liquid source material such that the chamber is normally closed and substantially isolated from environment when no source has been installed in a receptacle of the source fitting provided in the gas deposition reactor. The chamber of the source is formed such that it is still openable and closable when a source resides in the receptacle of the source fitting. The chamber may be opened automatically while installing the source in the receptacle of the source fitting or in a separate space connected to the source fitting, so that the chamber is also preferably closed when the source is removed from the receptacle or space. On the other hand, the chamber of the source may be opened completely independently of the installation of the source in place; this results in separate means for opening and closing the chamber after the source is installed inside the source fitting. In such an arrangement, the source may comprise special means for isolating the chamber, as well as operating means for opening and/or closing the chamber equipped with special means. The source fitting, in turn, may further be provided with charging means for installing and/or locking the source in place in the source fitting and/or for closing and sealing a receptacle of the source when the source resides in the receptacle. Alternatively, the aforementioned charging means as well as can be provided in connection with a separate space wherein a solid source is installable.

In the present context, a chamber refers to a space provided in a source and capable of receiving a source material. Hence, the shape, structure and properties of a chamber may vary as long as it is capable of receiving a source material being used. The chamber comprises at least one at least partly open wall which is closable and/or isolatable by means of cover-like isolating means which can be arranged onto the open wall of the chamber in order to isolate the chamber from environment. The chamber and the cover-like isolating means, in turn, are provided such that they are capable of sliding with respect to one another in order to open and close the chamber. Preferably, the isolating means and the chamber or the structure containing the chamber comprise sliding surfaces which slide against one another. In other words, the chamber is sealed by means of the sliding surfaces provided between the structure of the chamber and the isolating means. In the structure according to the invention, the direction of the open wall of the chamber, i.e. the opening direction, and the direction of movement of the chamber and/or the isolating means are preferably at an angle of approximately 90° C. with respect to one another.

In the present context, a source refers to a solid source for solid source materials or to a liquid source for liquid source materials. A solid material and a liquid material, in turn, refer to materials that are under normal conditions (NTP condition, pressure 1 atm and temperature 0° C.).

An advantage of the solution according to the invention is that it provides a source which operates like a cartridge, including all that is necessary for use. When the chamber of the source is isolated substantially from environment as well as controllably openable and closable, the solution according to the invention needs no valves, which enables even extremely high temperatures to be used which, in turn, enhances the range of source materials available. Furthermore, a simple cartridge-like structure allows a source to be replaced quickly and easily. Due to an isolated and, when desired, openable and closable chamber, a source can be replaced inertly, since the chamber can be kept isolated prior to installing the source, and it can be isolated again when the source is removed from a source fitting. Furthermore, a source according to the invention is inexpensive to manufacture, and it can be made from a completely inert material, such as glass. The source according to the invention enables small amounts of expensive/difficult-to-synthesize source materials which, in addition, can be kept constantly fresh. The structure of the source may also be connected with a secure source technology for inert transfer of source materials, which, in turn, reduces safety risks.

BRIEF DESCRIPTION OF THE DRAWINGS

The invention is now described in closer detail in connection with preferred embodiments and with reference to the accompanying drawing, in which FIG. 1 schematically shows an embodiment of the present invention wherein a source has been installed in a source fitting.

DETAILED DESCRIPTION OF THE INVENTION

Figure 1:
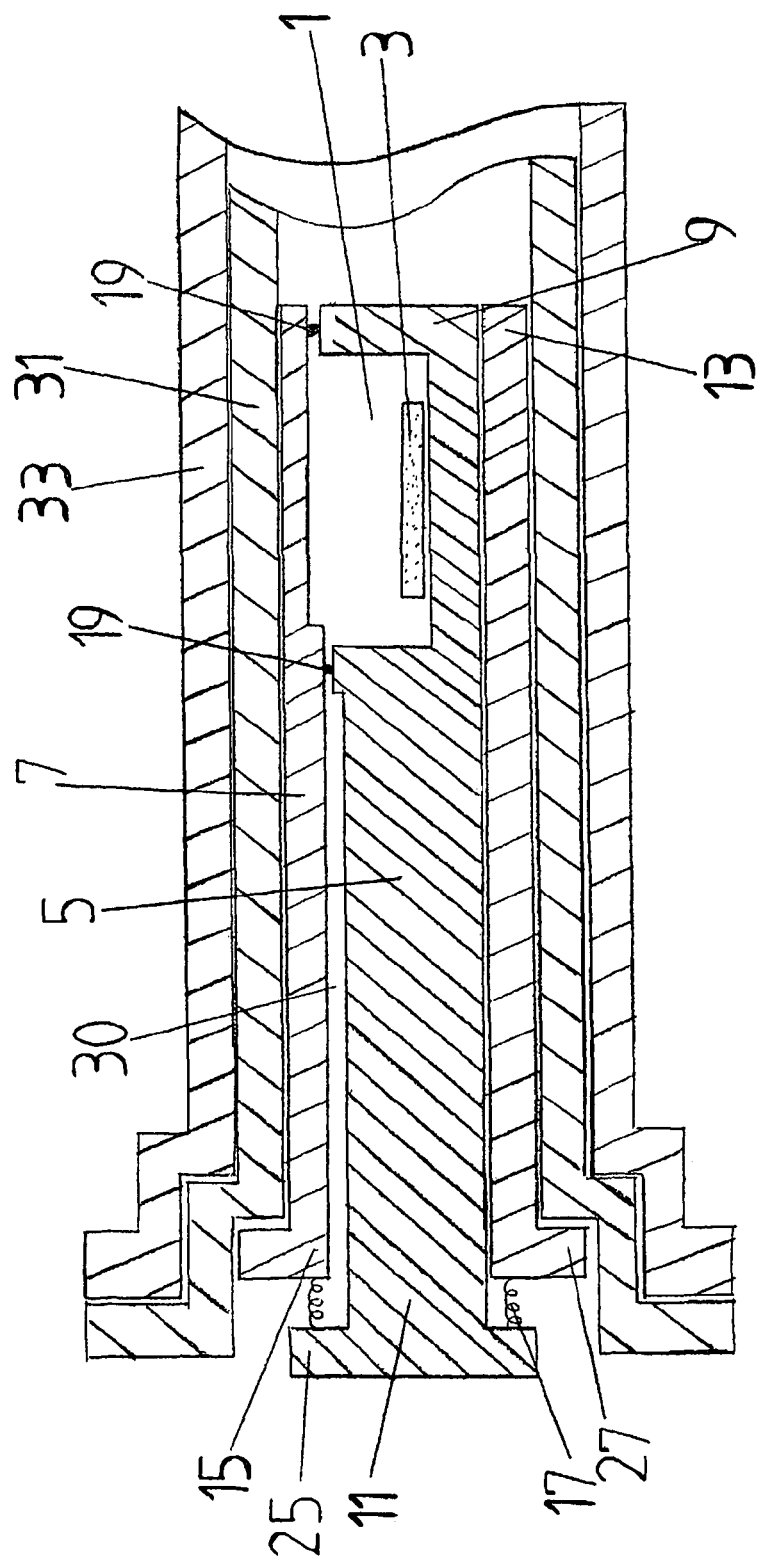

FIG. 1 schematically shows a cross-section of an embodiment according to the present invention after a source is installed inside a source fitting. In the case of FIG. 1, the source has been placed inside the source fitting but it has not yet been installed in an operating position, but it is ready for final installation.

The embodiment of FIG. 1 shows a source for gas deposition methods, the source being placed inside a source fitting provided in a gas deposition reactor. The source comprises a bar element 5 which has a first end 11 and a second end 9 and which, at the second end 9 or in the vicinity thereof, is provided with a chamber 1. The bar element, and thus also the chamber 1, is preferably made of glass, since glass is a very inert material which does not cause reactions during use of the source and which enables high operating temperatures. Preferably, the chamber 1 is provided in the vicinity of the second end 9 of the bar element 5 while manufacturing the bar element 5, or, alternatively, it has been worked therein by gouging. The bar element 5 is placed in the source fitting in accordance with FIG. 1, with its second end 9 first. The chamber 1 operates as a source crucible arranged to receive a solid or liquid source material 3 used in the gas deposition method. The size and shape of the bar element 5 and the chamber 1 provided therein may be selected as desired. In this embodiment, the bar element 5 is an elongated bar with a substantially circular cross-section.

In accordance with the invention, the chamber 1 provided in the bar element 5 is isolated by means of isolating means when no source has been installed in place in its operating position. The isolating means comprise a tube 7, or a tubular sleeve, which has a first end 15 and a second end 13 and which can be arranged around the bar element 5 such that it isolates the chamber 1 substantially from environment. The tube 7 may be arranged onto the bar element 5 over its entire length or over a section of the length of the bar element 5 only. The point is that the tube 7 settles at least over the chamber 1 provided in the bar element 5 when no source has been installed in its operating position inside the source fitting. The tube 7 is preferably dimensioned with respect to the bar element 5 such that it fits tightly around the bar element 5 so as to be capable of isolating the chamber 1 substantially from environment. The tube 7 is also preferably made of glass, so that it also contributes to ensuring the inertness of the source and the chamber 1 during use.

As shown in FIG. 1, the isolating means may further comprise seals 19 provided in the bar element 5 on both sides of the chamber 1 in a longitudinal direction of the bar element 5 such that the seals 19 are pressed against an inner surface of the tube 7 when the tube 7 resides on the bar element 5. The seals 19 may also be provided only on one side of the chamber 1 in the longitudinal direction of the bar element 5. Furthermore, it is possible to similarly provide the tube 7, rather than the bar element 5, with seals 19. The seals may consist e.g. of elastomer or graphite seals or other corresponding seals which are capable of sealing the chamber 1 off from environment.

In the embodiment shown herein, the bar element 5 is longer than the tube 7, so that the chamber 1 may be opened by pushing the bar element 5 into the tube 7 until the second end 9 of the bar element protrudes out of the second end 13 of the tube 7. Consequently, the chamber 1 provided at the second end 9 of the bar element 5 at least partly protrudes out of the second end 13 of the tube 7, opening the chamber 1 and presenting the solid or liquid source material 3 contained therein. Similarly, the chamber 1 can be closed by drawing the bar element 5 into the tube 7 such that the second end 9 of the bar element 5 withdraws into the tube 7. In such a case, the chamber 1 closes and enters a state of isolation from environment.

The source may further comprise operating means for opening and/or closing the isolated chamber 1 after the source is installed in the source fitting. In the present embodiment, the operating means are provided such that the isolating means, the tube 7, are movable by the operating means with respect to the chamber 1 or the bar element 5, or that the chamber 1 or the bar element 5 is movable by the operating means with respect to the isolating means, the tube 7, in order to open and/or close the chamber 1, which is substantially isolated from environment. In the solution according to FIG. 1, the operating means are provided such that the bar element 5 is movable in a direction of its longitudinal axis with respect to the tube 7, or that the tube 7 is movable in a direction of its longitudinal axis with respect to the bar element 5 in order to open and/or close the chamber 1, which is substantially isolated from environment. In the solution of FIG. 1, the operating means for opening and/or closing the chamber 1 comprise a first flange 25 arranged in the first end 11 of the bar element 5, and a second flange 27 arranged in the first end 15 of the tube 7, a spring 17 being provided between the first flange 25 of the bar element 5 and the second flange 27 of the tube 7. The spring 17 is installed such that when the spring 17 is in an uncompressed state, as shown in FIG. 1, the chamber 1 is in a state of substantial isolation from environment and closed, and when the spring 17 is in a compressed state, the chamber 1 is at least partly open. The spring 17 may also be arranged in another, alternative way which enables the chamber 1 to be opened and closed.

The operating means may further comprise means for compressing the spring 17 to open the chamber 1 and/or for releasing the spring 17 to close the chamber 1. These means may be provided in the source or, alternatively, in a source fitting of a gas deposition reactor, for instance. The means may operate e.g. such that while installing the source in place in the source fitting, these means open the chamber automatically for use, and when removing the source from the chamber 1, these means automatically close the chamber into an isolated state. The means then e.g. compress the spring 17, thus pushing the second end 9 of the bar element 5 out of the second end 13 of the tube 7, thereby opening the chamber when the source is being installed in the source fitting. Similarly, these means release the spring 17 when the bar element 5 is being removed from the source fitting, thereby closing the chamber 1.

The bar element 5 may still further comprise a channel 30 for a flow of a carrier gas, flushing gas or the like to be conducted over the chamber 1. This channel enables e.g. a gas flow to be fed between the tube 7 and the bar element 5 such that the gas flow passes over the open chamber 1 in order to convey the source material into a reaction space of a reactor.

The bar element 5 and the tube 7 may also be designed such that the bar element 5 is rotatable around its longitudinal axis with respect to the tube 7, or that the tube 7 is rotatable around its longitudinal axis with respect to the bar element 5 in order to open and/or close the chamber 1, which is substantially isolated from environment. In such a case, the tube 7 may be provided with an opening or indentation which, by the operating means, is movable so as to reside at the chamber 1 and/or away therefrom in order to open and/or close the chamber 1. In the case according to FIG. 1, the tube 7 may comprise an opening which, when the chamber 1 is isolated, resides below the bar element, in which case the chamber 1 is closed, and which, when the chamber 1 is open, resides above the chamber 1, thereby opening the chamber 1. Instead of an opening, an indentation provided at the second end 13 of the tube 7 may, for instance, be used, so that the indentation extends from the edge of the second end 13 of the tube 7 towards the first end 15. This further enables operating means to be provided for rotating the tube 7 and the bar element 5 relatively.

In accordance with the present invention, the operation of the source may also be such that the bar element 5 is movable in the direction of its longitudinal axis with respect to the tube 7, or that the tube 7 is movable in the direction of its longitudinal axis with respect to the bar element 5, and that the bar element 5 is rotatable in the direction of its longitudinal axis with respect to the tube 7, or that the tube 7 is rotatable in the direction of its longitudinal axis with respect to the bar element 5 in order to open and/or close the chamber 1, which is substantially isolated from environment. Hence, in order to open and close the chamber 1, the relative longitudinal movement and the relative rotating movement around the longitudinal axis of both the tube 7 and the bar element 5 are combined. This may further be carried out by the operating means provided for opening and closing the chamber 1.

In all the above-described cases, the operating means may be formed as independent means such that they are connected to control means provided in a gas deposition reactor to enable the operating means to be activated in order to open and/or close the chamber 1. In such a case, the operating means may be manually, electrically, or otherwise similarly operable.

Similarly, the carrier gas flow may be conveyed through the inside of the source or on the surface thereof, i.e. either between the tube and the bar element or on the outer surface of the tube.

An end of the tube or a portion thereof, preferably in the vicinity of the second end 13 of the end may also be made of a porous material, such as sinter, so that this porous section may be turned to reside at the chamber so as to enable the source material to flow through the porous section. The chamber thus opens to the surrounding space via this porous section, which may also serve as a filter. This enables disadvantages due to dusting of the source material to be avoided.

In accordance with the present invention, a source may be implemented in a number of alternative ways, one example thereof given above. The most important point in the invention is that the source comprises a chamber which is capable of receiving a solid or liquid source material and wherein it can be isolated substantially from environment. The source is further implemented such that the solid or liquid material may be inserted into a gas deposition reactor as isolated from environment, and that after the source is installed in its place in the reactor, the chamber may be opened for use. Furthermore, the invention is advantageous in that the chamber may be closed back into the isolated state when it is removed from the reactor. The source thus operates in a cartridge-like manner, being inserted in a receptacle provided in the reactor, wherein it is opened for use and closed after use and wherefrom it is removed after use. The source thus comprises structures necessary for enabling the source to be used without any separate isolating means or valves. It is thus obvious that it is not necessary to manufacture the source as an elongated structure according to FIG. 1, but the shape and structure thereof, as well as the isolation arrangements and operating means and methods for opening the chamber, may vary. It is not necessary to insert the source completely inside the source fitting of the reactor, but it may be inserted therein only as far as the chamber is concerned. In addition, when necessary, the shape and structure of sources to be installed even in the same source fitting may vary according to the properties of a given source material.

Alternatively, the cover-like isolating means in the form of a tube 7 may also be replaced by plate-like, flat, curved, etc. covers which may be installed onto the open wall of the chamber in order to isolate the chamber from environment. As in the case in connection with the tube 7, a cover is also arranged to slide with respect to the chamber in order to open and close the chamber. Consequently, the sliding surfaces of the chamber or its structure and the cover slide against one another. According to the invention, the cover or tube 7 may slide completely or partly off from the top of the open wall of the chamber, or, similarly, the cover and/or tube and/or the chamber may be formed such that when they move with respect to one another, a flow path opens up from the chamber even if the cover or tube does not even partly move off from top of the open wall of the chamber. In such a case, a gap may occur between the structure/edges of the chamber and the cover or tube, through which the source material is allowed to flow out of the chamber.

According to the present invention, an arrangement may further be provided for installing a source into a gas deposition reactor. The arrangement comprises at least one source fitting connected to a reaction space of the gas deposition reactor for a source, and a source installable at least partly inside the source fitting. The source to be used is preferably as described above but, alternatively, it may also be different.

This arrangement comprises reception means, provided in the source fitting, for receiving the source, and charging means for installing the source in place in the source fitting for use, and a chamber 1 provided in the source for a solid or liquid source material 3, and isolating means 7, 19 for isolating the chamber 1 substantially from environment. The isolating means 7, 19 are formed such that the isolation of the chamber 1 is optionally openable and/or closable when the source resides in the source fitting.

The reception means provided in the source fitting comprise a connective recess or receptacle defined by tubular parts 31 and 33 and arranged to receive a source. Preferably, the inner tubular part 31 and the outer tubular part 33 are made of metal such that the source fitting they partly constitute is still connected to the reactor space of the gas deposition reactor. The reception means may also form a receptacle of another type which is able to receive a source.

The charging means provided in the source fitting are arranged to lock the source in place in the source fitting, and to open the locking of the source and/or to close and open the receptacle of the source fitting. The charging means preferably comprise a hatch which, in the solution according to FIG. 1, may be arranged on top of the bar element 5 of the source and the first ends 11 and 15 of the tube 7 such that the source fitting closes, whereby the source completely remains inside the source fitting. The hatch is preferably manually operated, so it is quick and easy to open and close. Alternatively, the hatch may be such that it is used by separate means e.g. electrically. In the embodiment of FIG. 1, the hatch may also be made to open the isolation of the chamber 1 of the source when the source fitting is being closed and/or to close the isolation of the chamber when the source fitting is being opened. In such a case, closing and opening the hatch generates a relative movement of the bar element and the tube so that the chamber 1 opens. Use of the charging means then makes the operating means to open and close the chamber, which is isolated by the isolating means 7, 19. In FIG. 1, the hatch compresses the spring 17, whereupon the bar element 5 protrudes out of the second end 13 of the tube 7, thereby opening the chamber 1. The hatch may be further equipped with seals to seal the source fitting when the hatch is being closed. Alternatively, the charging means may be provided such that the source is locked automatically into the receptacle of the source fitting when it is pushed into place, whereby the locking of the source may be opened using a separate push button or the like. Alternatively, the charging means may be completely electrically-operated such that they lock the source in its operating position and release it therefrom.

However, the arrangement may also comprise separate operating means provided in the source fitting in order to open and/or close the chamber 1 of the source from the isolation provided by isolating means. The procedures of opening and closing the chamber 1 are then completely independent of the installation of the source in the source fitting. In such a case, a user is also free to open and close the chamber 1 in accordance with the desired operating sequences, with no need to necessarily remove the source from the source fitting in order to close the chamber 1.

The arrangement may further comprise at least one set of gas feeding means for blowing a carrier gas, flushing gas or the like to the source fitting, preferably between the bar element 5 and the tube 7. The source fitting may further be provided with heating means for heating the solid or liquid source material contained in the chamber of the source. The heating means may be e.g. resistors. After the source is installed in the source fitting, the source may be completely isolated from environment by using an isolation arrangement. For this purpose, the aforementioned hatch or another isolation arrangement may be employed to reduce or eliminate a contamination risk when the source resides in place in the source fitting.

In the method according to the present invention for installing a source into a gas deposition reactor and removing the same therefrom, the source, which comprises a substantially from environment isolatably closable and openable chamber for a solid or liquid source material, is first inserted at least partly, i.e. inside at least a portion of the chamber, inside the source fitting of the gas deposition reactor when the chamber is closed. Next, the source fitting is closed and the chamber of the source is opened to enable the source material to be used. After using the source or in order to stop the use of the source, the chamber of the source is closed and the source fitting is opened for removal of the source, after which the source is removed from the source fitting of the gas deposition reactor. In addition, when the source resides in place and the chamber is open, the method may include feeding a carrier gas over the chamber for utilizing the solid or liquid source material.

However, it is to be noted that the arrangement may also comprise a separate space connected to the source fitting, in which the source can be installed. In such a case, the source may be installed at least partly inside this space. This space may be any charging space arranged to receive a source and connected to a source fitting, or even directly to a reaction space. Otherwise this space may operate in a manner similar to that described in connection with the source fitting above.

In the method, the procedures of opening the chamber and closing the source fitting as well as closing the chamber and opening the source fitting may be combined such that closing the source fitting opens the chamber automatically, and that opening the source fitting, in turn, closes the chamber automatically. On the other hand, the procedures of opening and closing the chamber may be completely independent procedures that are not associated with closing or opening the source fitting. Hence, the chamber of the source may be opened and closed while it resides in the source fitting, in accordance with the desired operating sequences. When desired, the method of the invention may be used when replacing a source and, particularly, a solid or liquid source material being used. The method may be applied in closer detail in connection with the source and arrangement described above by employing the structureal properties disclosed therein.

It is apparent to a person skilled in the art that as technology advances, the basic idea of the invention may be implemented in many different ways. The invention and its embodiments are thus not restricted to the above-described examples but may vary within the scope of the claims.

The invention claimed is:

1. A source of a solid or liquid material for gas deposition reactors, the source being insertable at least partly inside a fitting connected to a reaction space of a gas deposition reactor, the source comprising a bar element which has a first end and a second end, a chamber for a solid or liquid source material arranged on the second end of the bar element or in a vicinity thereof, the chamber comprising at least one at least partly open wall, and a tube arranged over the bar element, wherein the tube is arranged to form a cover-like isolating means arranged onto the at least partly open wall of the chamber for isolating the chamber from environment, such that the tube and the chamber are arranged to be slid with respect to one another in order to open or close the chamber after the source is installed in the fitting.

2. A source as claimed in claim 1, further comprising operating means for opening or closing the chamber, wherein the tube is movable by the operating means with respect to the chamber, or the chamber is movable by the operating means with respect to the tube in order to open or close the chamber, which is substantially isolated from environment.

3. A source as claimed in claim 2, wherein the operating means are provided such that the bar element is movable in a direction of a longitudinal axis of the bar element with respect to the tube, or that the tube is movable in the direction of the longitudinal axis of the bar element with respect to the bar element in order to open or close the chamber, which is substantially isolated from environment.

4. A source as claimed in claim 3, wherein the tube further comprises a first end and a second end and the tube is arranged at least partly around the bar element such that the tube isolates the chamber substantially from environment.

5. A source as claimed in claim 4, wherein the bar element is longer than the tube, so that the chamber opens or closes such that the bar element is movable in the direction of the longitudinal axis of the bar element inside the tube until at least a portion of the chamber provided at the second end of the bar element or in the vicinity thereof protrudes out of the second end of the tube or until the chamber is completely withdrawn into the tube.

6. A source as claimed in claim 4, wherein the operating means for opening or closing the chamber comprise a first flange arranged in the first end of the bar element, and a second flange arranged in the first end of the tube, the operating means comprising at least one spring provided between the first flange of the bar element and the second flange of the tube.

7. A source as claimed in claim 6, wherein when the spring is in an uncompressed state, the chamber is in a state of substantial isolation from environment and closed, and when the spring is in a compressed state, the chamber is at least partly open.

8. A source as claimed in claim 6, wherein the operating means are arranged to compress the spring in order to open the chamber or to release the spring in order to close the chamber.

9. A source as claimed in claim 4, wherein the bar element is rotatable around the longitudinal axis of the bar element with respect to the tube, or wherein the tube is rotatable around the longitudinal axis of the bar element with respect to the bar element in order to open or close the chamber, which is substantially isolated from environment.

10. A source as claimed in claim 4, wherein the tube is provided with at least one of an opening, indentation, or a porous area which, by the operating means, is movable so as to reside at the chamber or away from the chamber in order to open or close the chamber.

11. A source as claimed in claim 4, wherein the bar element is movable in the direction of the longitudinal axis of the bar element with respect to the tube, or wherein the tube is movable in the direction of the longitudinal axis of the bar element with respect to the bar element in order to open or close the chamber, which is substantially isolated from environment.

12. A source as claimed in claim 1, wherein the chamber is a source crucible arranged to receive the solid or liquid source material.

13. A source as claimed in claim 1, wherein the tube further comprises seals provided in the bar element on at least one side of the chamber in a longitudinal direction of the bar element such that the seals are pressed against an inner surface of the tube after the tube is arranged onto the bar element.

14. A source as claimed in claim 1, wherein the tube further comprises a substantially planar or curved cover, which is arranged at least partly onto the open wall of the chamber such that it isolates the chamber substantially from environment.

15. A source as claimed in claim 1, wherein the operating means are connected to the gas deposition reactor so as to enable the operating means to be activated in order to open or close the chamber.

16. A source as claimed in claim 1, wherein the tube is provided such that the isolation of the chamber is opened or closed when the source resides in the source fitting by sliding the tube and the chamber in respect to one another.

17. A source as claimed in claim 1, wherein at least one of the chamber, the bar element or the tube are at least partly made of glass.

18. A source as claimed in claim 1, wherein the bar element further comprises a channel for a flow of a carrier gas or flushing gas to be conducted over the chamber.

* * * * *